United States Patent [19]
Oda

[11] Patent Number: 5,502,335
[45] Date of Patent: Mar. 26, 1996

[54] SEMICONDUCTOR DEVICE WITH WIRING LAYER

[75] Inventor: Noriaki Oda, Tokyo, Japan

[73] Assignee: NEC Corporation, Tokyo, Japan

[21] Appl. No.: 260,608

[22] Filed: Jun. 15, 1994

Related U.S. Application Data

[63] Continuation of Ser. No. 962,414, Oct. 16, 1992, abandoned.

[30] Foreign Application Priority Data

Oct. 18, 1991 [JP] Japan .................... 3-269810

[51] Int. Cl.⁶ .......................... H01L 23/532; H01L 29/43
[52] U.S. Cl. ................. 257/751; 257/764; 257/767; 257/769; 257/775
[58] Field of Search .............................. 257/754–756, 257/773, 751, 750, 763, 775, 664, 926, 764, 767, 769

[56] References Cited

U.S. PATENT DOCUMENTS

| | | | |
|---|---|---|---|
| 4,800,176 | 1/1989 | Kakumu et al. | 257/750 |
| 4,833,519 | 5/1989 | Kawano et al. | 257/756 |
| 4,935,804 | 6/1990 | Ito et al. | 257/754 |
| 5,254,872 | 10/1993 | Yoda et al. | 257/751 |

FOREIGN PATENT DOCUMENTS

| | | | |
|---|---|---|---|
| 0148436 | 9/1983 | Japan | 257/926 |
| 0216448 | 9/1986 | Japan | 257/926 |
| 0084053 | 4/1988 | Japan | 257/926 |
| 0278352 | 11/1988 | Japan | 257/763 |
| 0270347 | 10/1989 | Japan | 257/755 |
| 0201482 | 9/1991 | Japan | 257/767 |
| 0105363 | 4/1992 | Japan | 257/751 |

*Primary Examiner*—Peter Toby Brown

[57] ABSTRACT

The present invention relates to a semiconductor device which has a wiring system including a wiring formed by completely surrounding a periphery of isolation films with a metal conductor as a main wiring material as viewed in a cross sectional profile and a contact opening and a through hole opening where the main wiring material is buried and a manufacturing method thereof.

7 Claims, 5 Drawing Sheets

SEMICONDUCTOR DEVICE WITH WIRING LAYER

This is a continuation of application Ser. No. 07/962,414, filed Oct. 16, 1992, now abandoned.

BACKGROUND OF THE INVENTION

1. Field of the Invention

This invention relates to semiconductor devices and manufacturing methods of a semiconductor devices, and more particulaly to a semiconductor device using a radio-frequency current and a manufacturing method of such semiconductor devices.

2. Description of the Prior Art

Conventional semiconductor devices, as shown in FIG. 1, respectively have an isolation film 3a which selectively has a contact opening 2 on a semiconductor substrate 1 having a diffusion layer 1a, a first layer wiring which is made of gold 4 having titanium-tungsten 6 and platinum 5 in this order from the bottom on the isolation film 3a at least including the contact opening 2, an isolation film 3b which selectively has a through hole opening 7 therein and a second layer wiring made of gold 4, which has titanium-tungsten 6 at its bottom, on the isolation layer 3b at least including the through hole opening 7. The isolation layer 3b selectively having the through hole opening 7 and the wiring thereon are repeatedly formed until a desired number of wiring layers is reached and an isolation film 3c for covering is provided on the top layer wiring. In this case, wiring materials include aluminum and aluminum alloy having titanium-tungsten at its bottom, in addition to gold having titanium-tungsten at its bottom as shown in this example.

Materials of isolation films 3a, 3b and 3c are as follows.

A silicon oxide film formed by the CVD method or a plasma method is often used as an isolation film on the semiconductor substrate 1. An inorganic isolation film such as silicon oxide film formed by the plasma CVD method or an organic or inorganic coating film or a type of structure which is formed by compositely multi-layering these films are often used as an inter-layer isolation film including the wiring and others thereon. In addition, an organic coating film such as polyimide is often used as the uppermost covering isolation film.

Near-the-surface and internal portions of the main material of the wiring are made of the same kind of metal.

Since both surface and internal portions of the wiring of semiconductor devices having the above described conventional wiring structure are made of the same metal, a high frequency current which flows through the wiring intensively flows near the surface of the wiring due to the surface effect when the semiconductor devices are operated with a high frequency and therefore there have been problems that the current inside the wiring reduces, the apparent cross section also reduces, and the wiring resistance increases, thus causing the semiconductor devices to be unsuitable for a high speed operation.

SUMMARY OF THE INVENTION

An object of the present invention is to prevent an increase of the apparent resistance of the wiring and the slowdown of operating speed which results from an intensive flow of the high frequency current, which runs through the wiring, near the surface of the conductor due to the surface effect when the semiconductor device is operated with a high frequency.

To achieve the above described object, the present invention provides a semiconductor device comprising a wiring system including a wiring formed with isolation films the periphery of which is completely covered with a metal conductor which is the main wiring material as viewed in a cross sectional profile.

The wiring system may be formed, which has a metal conductor, which is a barrier metal layer and the main wiring material, at the side and bottom of the contact opening, a bond layer between the main wiring material made of a metal conductor and the inter-layer isolation film and the main wiring material at the side and bottom of the through hole opening, and a structure wherein an isolation member is buried in the contact opening, the through hole opening and the wiring which covers the through hole opening.

In an embodiment, a wiring system can be formed which has a barrier metal layer at the side and bottom of the contact opening and a construction in which a metal conductor, which is the main wiring material, is completely buried inside the contact opening and in the through hole opening.

In an embodiment, a wiring system can be formed which has a barrier metal layer at the side and bottom of the contact opening and a construction in which tungsten is buried inside the contact opening and a metal conductor, which is the main wiring material, is buried in the through hole opening.

In another embodiment, a wiring system can be formed which has a barrier metal layer at the side and bottom of the contact opening and a construction in which tungsten is buried inside the contact opening and in the through hole opening.

In a further embodiment, a wiring system can be formed, which has a metal conductor, which is the main wiring material surrounding the periphery of isolation film, with a thickness which is $(3/2)\times\delta$ or over and $(5/2)\times\delta$ or under in reference to the skin depth as $\delta$.

In this case, the skin depth $\delta$ is defined as given below with $\omega$ as angular frequency, $\sigma$ as conductivity of the metal conductor and as permeability of the isolation around the wiring.

$$\delta = \sqrt{2/\omega\sigma\mu}$$

In addition, the present invention provides a semiconductor producing method comprising a process of forming the first inorganic isolation film on a semiconductor substrate, a step of selectively providing a contact opening on the first isolation film, a step of forming in sequence titanium-tungsten, platinum, first gold layer and second isolation film, a step of selectively forming a groove in an area of a second isolation film where a wiring will be formed later, a step of forming a side wall comprising a third isolation film on the side wall of the groove, a step of forming a fourth isolation film by a rotary coating method, a step of maintaining the fourth isolation film at the bottom of the groove by etching, a step of removing the side wall comprising the third isolation film by wet etching, a step of forming a second gold layer to surround the fourth isolation film by a plating method with titanium-tungsten, platinum and the first gold layer as a power supply layer, a step of removing the second isolation film by etching, and a step of removing portions of the first gold layer, platinum and titanium-tungsten other than the portions which form the wiring.

The above described semiconductor device may be manufactured by a method comprising the steps of forming the first inorganic isolation film on a semiconductor substrate, selectively forming a contact opening on the first isolation film, forming in sequence titanium-tungsten, platinum and the first gold layer, applying a photoresist and removing the photoresist on the contact opening by a photo-lithography process, forming the second gold layer up to the upper end of the contact opening by a plating method with the titanium-tungsten, platinum and the first gold layer as a power supply layer, removing the photoresist, forming the third isolation film and selectively forming a groove in an area where the wiring will be formed later, forming a side wall comprising the fourth isolation film on the side wall of the groove, forming the fifth isolation film by a rotary coating method, retaining the fifth isolation film on the bottom of the groove by etching, removing the side wall comprising the fourth isolation film by wet etching, forming the second gold layer to surround the fifth isolation film by a plating method with the titanium/tungsten, platinum and the first gold layer as a power supply layer, applying a photoresist, removing the photoresist from a portion where a through hole will be formed later by exposure and development, forming a gold layer as thick as an interlayer isolation film at a portion where a through hole will be formed in the future by a plating method and removing the photoresist, removing the third isolation film by etching, a process for removing the first gold layer, platinum and titanium-tungsten other than the portion where the wiring is formed, and forming the sixth isolation film by a rotary coating method and exposing the upper portion of the gold layer at the portion where a through hole will be formed later by whole surface etching.

The present invention provides an effect that, when the semiconductor device is operated with a high frequency, an influence due to the skin effect can be restricted, an apparent increase of the resistance of the wiring can be controlled and high speed operation can be maintained since the wiring system including the wiring, which is constructed to completely surround the periphery of the isolation films with a metal conductor which is the main wiring material, is provided and therefore the surface of the conductor forming the wiring exists not only outwardly but also at a boundary with the isolation film which is internally buried. The manufacturing method for the semiconductor device in accordance with the present invention also has an effect that allows to provide a semiconductor device having the above described effect by conducting the photo-lithography as many times as conventional.

In addition, to solve a problem such as large resistance of the contact and the through hole, the semiconductor manufacturing method is advantageous in that such contact resistance and through hole resistance can be reduced and the semiconductor device can be adapted to high speed operation by burying a metal conductor, which is the main wiring material, in the contact opening and the through hole opening portions.

The manufacturing method of the present invention can provide an advantage which allows to prevent deterioration of the barrier property of the contact opening with a large aspect ratio which results from the low step covering effect of the barrier metal by burying tungsten in the contact opening portion.

In addition, the present invention can provide an advantage that allows to uniformly bury tungsten in the through hole opening portion up to its upper end and prevent forming of a protrusion of the wiring for the upper layer at the through hole portion against variations of the depth of the through hole which may occur when a coating film type material is used as the interlayer isolation film, by burying tungsten also in the through hole opening portion.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Figure 2:
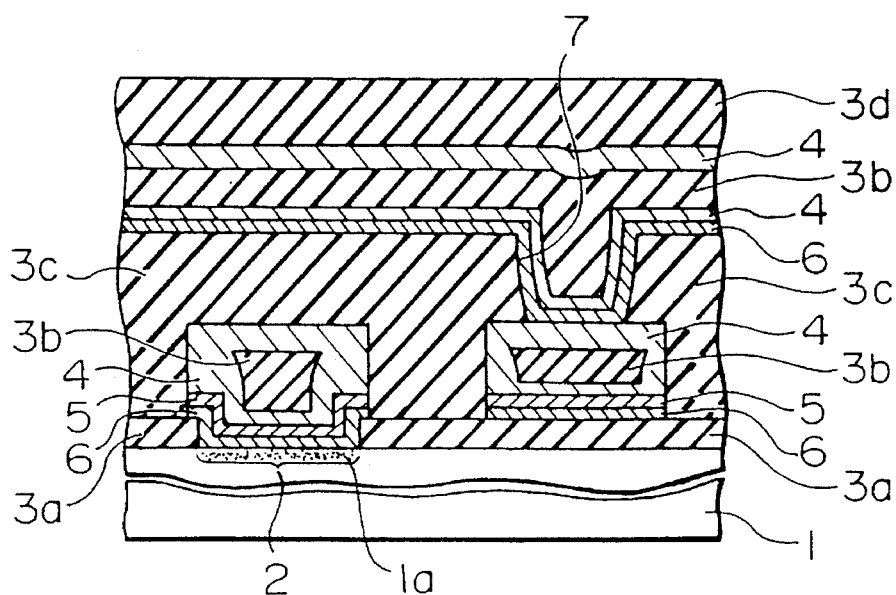
FIG. 2 is a rough sectional view showing a semiconductor device of the first embodiment of the present invention.

The present invention is described below in detail, referring to the drawings thereof. FIG. 2 is a sectional view showing a semiconductor device of the first embodiment of the present invention.

An isolation film 3a which selectively has a contact opening 2 is provided on a semiconductor substrate 1 having a diffusion layer 1a, a first layer wiring made of gold 4 as main material is provided on the isolation film 3a including the contact opening 2, platinum 5 and titanium-tungsten 6 are provided in this order from the upper side on the underside of gold 4, and an isolation film 3b is internally buried in a cavity of the first layer wiring 4. An isolation film 3c which selectively has a through hole opening 7 is provided on the first layer wiring to cover the whole surface of the wiring and the second layer wiring is provided on the isolation film 3c including the through hole opening 7. This second layer wiring has a construction in which titanium/tungsten layer 6 is formed on the underside of gold layer 4 which is the main material and the isolation film 3b is internally buried. The isolation film 3b for the purpose of covering exists on the second layer wiring to cover the wiring as a whole. In this embodiment, there are provided only two layers of wiring. In case of three or more layers of wiring, the construction of the third or upper layer is the same as that of the second layer. Platinum 5 below the first layer wiring serves as a barrier metal which prevents abnormalities such as junction breakdown due to diffusion of gold, as wiring material, into the semiconductor substrate 1 during thermal treatment in the following processes and titanium-tungsten 6 serves to maintain tight adhesion between the isolation films 3a and 3b and the gold layer 4. Platinum 5, titanium-tungsten 6 and gold layer 4 are provided on the internal side walls and lower portions of the contact opening 2 and the through hole opening 7 and the isolation film 3b is provided from the central portions of these openings to the center of the upper layer wiring.

In the first embodiment, a current runs through the wiring which surrounds the isolation film 3b when the semiconductor device is operated with a high frequency and therefore an intensive flow of the current near the surface of the wiring due to the skin effect can be relieved to ensure uniform flow of the current in the conductor. Accordingly, the apparent resistance of the wiring can be reduced as compared with a case where no isolation film is provided in the wiring as in the conventional embodiment and, the semiconductor device according to the present invention can meet higher speed operation. Titanium-tungsten 6 which exists on the bottom of the gold wiring maintains tight adhesion between gold and isolation films.

Figure 3A:
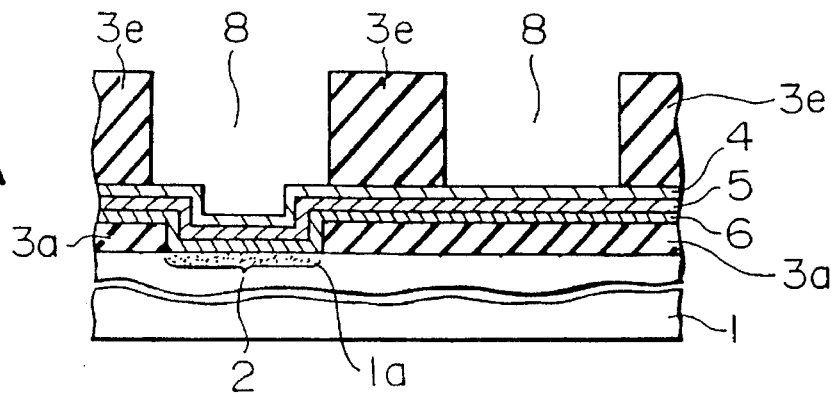
FIGS. 3A to 3D are respectively rough sectional views showing an embodiment of a manufacturing method for semiconductor devices according to the present invention in the order of process steps.
Figure 3B:
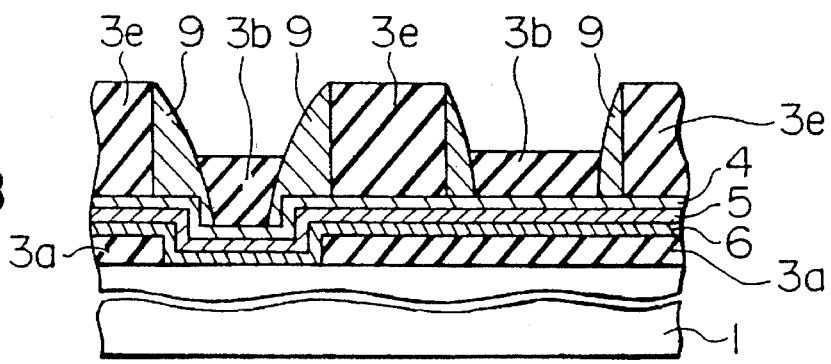

The folowing describes the steps of the manufacturing method according to the present invention, referring to FIGS. 3A to 3B.

As shown in FIG. 3A, an inorganic isolation film 3a is formed on the semiconductor substrate 1 having a diffusion layer 1a, a contact opening 2 is provided by a photo-lithography process and dry etching, titanium-tungsten 6, platinum 5 and gold 4 are formed by a sputtering method, an isolation film 3e which covers the wiring as a whole is formed, and a groove 8 is formed at an area where the wiring will be formed later by the photo-lithography process and reactive ion etching.

The, as shown in FIG. 3B, a silicon oxide film 9 is formed by a plasma CVD method, the silicon oxide film 9 is left on the side wall of the groove 8 by anisotropic reactive ion etching, an organic or inorganic isolation film 3b is formed by spin coating and heat treatment, and the isolation film 3b is remained at halfway of the groove 8 by wet or dry etching. The isolation film 3b to be remained in the groove 8 and the isolation film 3e which exists at the area where the wiring will not be formed later can be made of the same material; for example, a polyimide-based coating film is used. The oxygen plasma etching is, for example, used for etching the isolation film 3b and the upper end of the isolation film 3b after etching is lower than the upper end of the isolation film 3e.

Figure 3C:
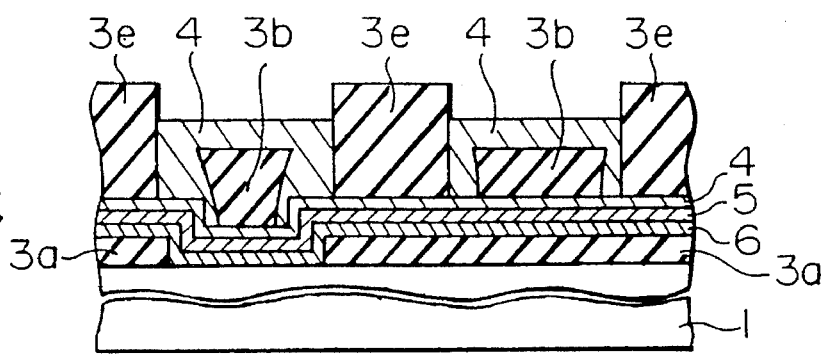

Then, as shown in FIG. 3C, the silicon oxide film 9 is removed with a hydrofluoric acid buffer by wet etching and gold 4 is formed by a plating method so that the upper end of the isolation film 3b is completely covered by gold 4.

Figure 3D:
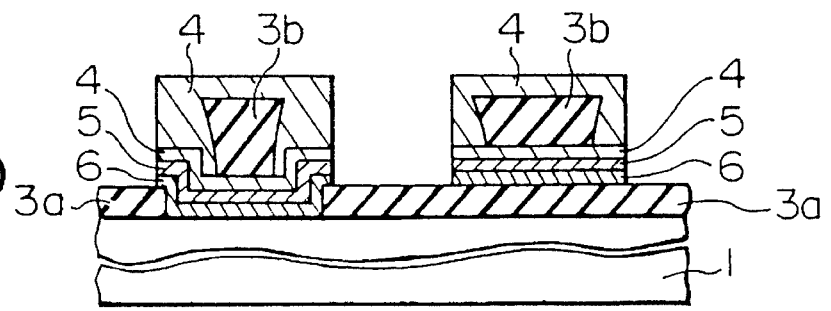

Then, as shown in FIG. 3D, the isolation film 3e except the wiring area is removed by etching, and gold 4, platinum 5 and titanium-tungsten 6 other than the wiring are removed by ion milling. In this case, gold of the upper portion of the wiring is slightly removed and therefore the thickness of plated gold need be increased so that the isolation film 3b in the wiring is not to be exposed. The above procedures are the process flow for forming the first layer wiring. Further, for forming the second and following wiring layers, a desired number of wiring layers can be obtained by repeating the processes shown in FIGS. 3A to 3D while omitting sputtering and ion milling of platinum 5 after forming the interlayer isolation film 3c.

Figure 1:
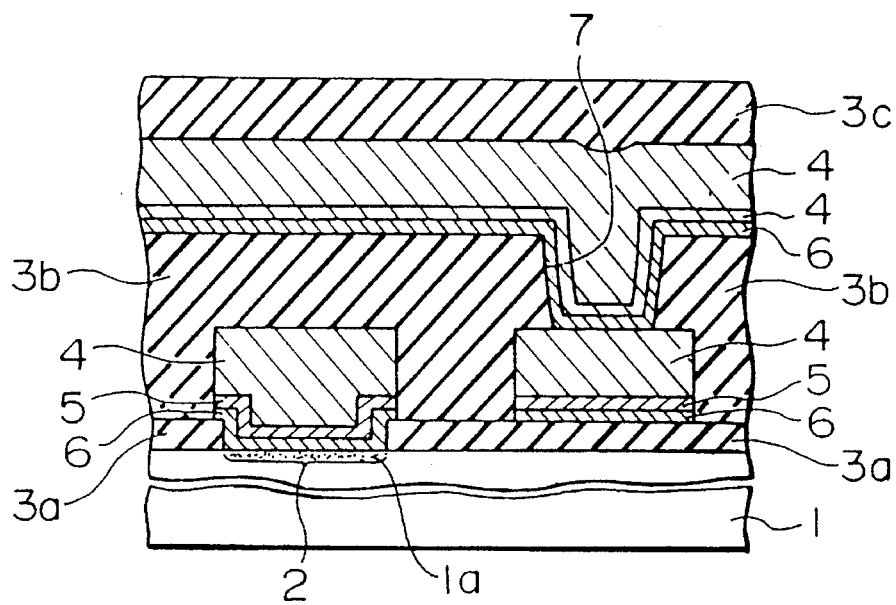
FIG. 1 is a rough sectional view showing a semiconductor device in accordance with the prior art.

An advantage of this manufacturing method is that semiconductor devices with complex structures can be formed by the same number of times of photo-lithography process as compared with the manufacturing method for the conventional wiring system shown in FIG. 1.

The semiconductor device shown in FIG. 2 can be made by this manufacturing method.

A semiconductor device of the second embodiment of the present invention is described below, referring to FIG. 4.

This embodiment differs from the semiconductor device shown in FIG. 2 only in that titanium-tungsten 6 and platinum 5 are provided as a barrier metal layer at the side and bottom of the contact opening 2 and gold 4a, which is the main wiring material, is completely buried therein and that gold 4b, which is the main wiring material, is completely buried in the through hole opening 7. In this embodiment, the semiconductor device is advantageous in that the contact opening and the through hole opening are buried with the same metal conductor as the wiring material and therefore the contact resistance and the through hole resistance can be reduced and high speed operation can be ensured.

Another embodiment of the manufacturing method of the semiconductor device according to the present invention is described below, referring to FIGS. 5A to 5D.

Figure 5A:
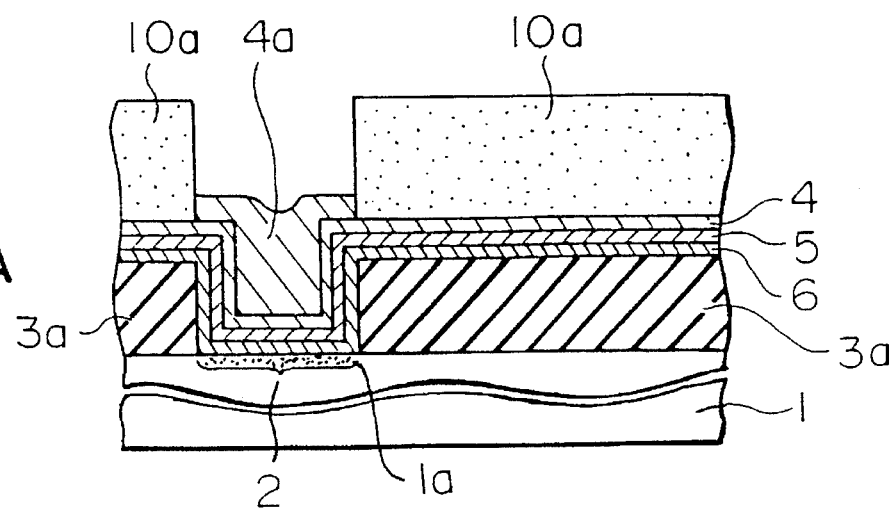
FIGS. 5A to 5D are respectively a rough sectional view showing another embodiment of a manufacturing method for semiconductor devices according to the present invention in the order of process steps.

As shown in FIG. 5A, an inorganic isolation film 3a is formed on a semiconductor substrate 1 having a diffusion layer 1a, a contact opening 2 is provided by a photo-lithography process and dry etching, titanium-tungsten 6, platinum 5 and gold 4 are formed by a sputtering method, a photoresist 10a is applied, the photoresist on the contact opening 2 is removed by the exposing and developing processes, and gold 4a is formed so that the contact opening 2 is completely buried.

Figure 5B:
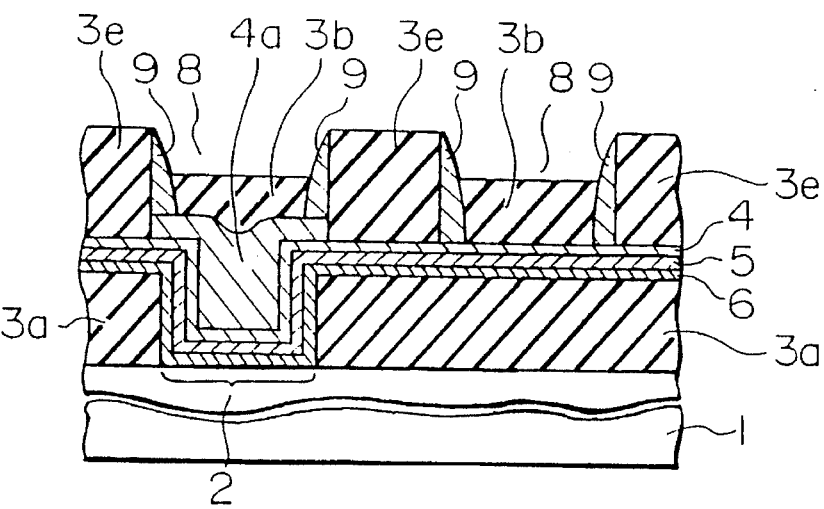

Then, as shown in FIG. 5B, the photoresist 10a is removed, the isolation film 3e is formed, the groove 8 is selectively formed at the area where the wiring will be formed later, the silicon oxide film 9 is formed on the wiring as a whole, the silicon oxide film 9 is remained on the side wall of the groove 8 by an isotropic dry etching, and the isolation film 3b is formed by the rotary coating method and remained at the bottom of the groove 8 by etching.

Figure 5C:
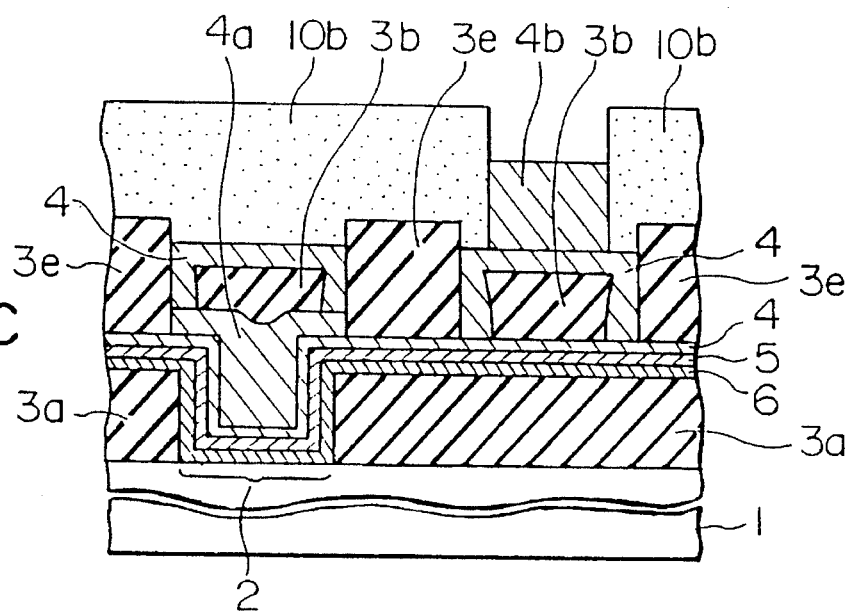

Then, as shown in FIG. 5C, the silicon oxide film 9 on the side wall of the groove 8 is removed by wet etching with a hydrofluoric acid buffer, gold 4 is formed to surround the isolation film 3b by a plating method with titanium-tungsten 6, platinum 5 and gold 4 as a power supply layer, subsequently the photoresist 10b is applied, the photoresist 10b at a portion where a through hole will be provided later is removed by exposing and developing treatments, and gold 4b as thick as an inter-layer isolation film in which the through hole will be provided later is formed by the plating method at a portion where the through hole will be provided.

Figure 5D:
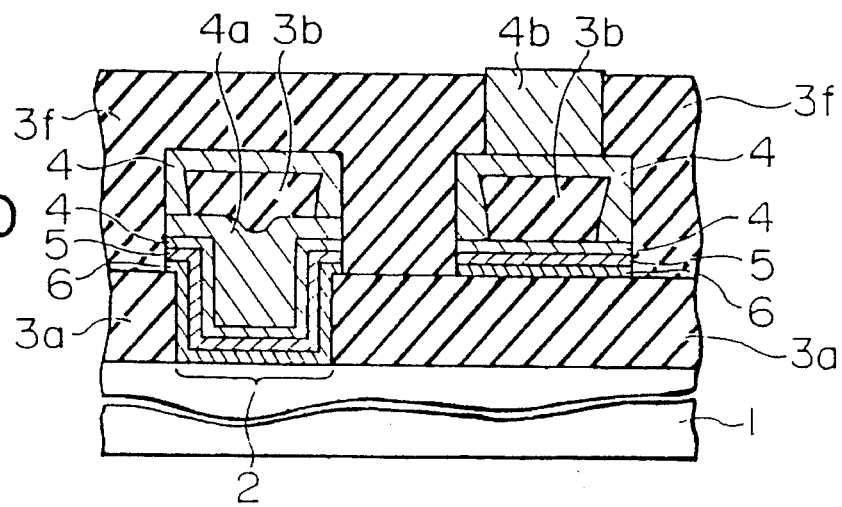

Then, as shown in FIG. 5D, the photoresist 10b is removed, the isolation film 3e is removed by etching, gold 4, platinum 5 and titanium-tungsten 6, at portions other than the wiring portion are removed, the isolation film 3f is formed by the rotary coating method, and the upper part of gold 4b at a portion where the through hole will be provided later is exposed.

Subsequently, the power supply layer to be plated is formed and a desired number of wiring layers are formed by repeating the processes shown in FIGS. 5A to 5D. Finally, the isolation film 3d for covering is formed. FIG. 4 is a complete diagram in case of two wiring layers. The manufacturing method shown in FIGS. 5A to 5D requires the photo-lithography process for selecting the contact opening two times, one more than in the method shown in FIGS. 3A to 3D. Even when the depth to diameter ratio (aspect ratio) of the contact opening and the through hole opening is large, gold is completely buried in the contact opening and the through hole opening by the plating method and therefore a semiconductor device with a small contact resistance and a through hole resistance can be provided.

The following describes a semiconductor device of the third embodiment of the present invention, referring to FIG.

Figure 4:
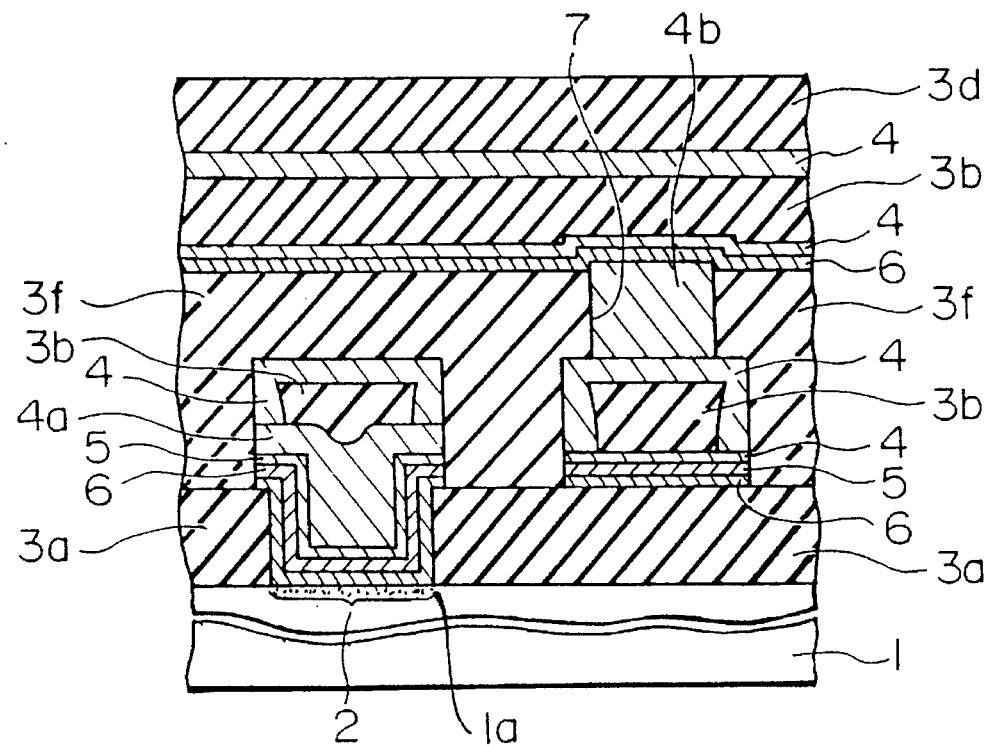
FIG. 4 is a rough sectional view showing a semiconductor device of the second embodiment of the present invention.

6, this embodiment differs from the second embodiment shown in FIG. 4 only in the point that the contact opening 2 is completely buried only with tungsten 11 and titanium-tungsten 6, platinum 5 and gold 4 are formed thereon. The third embodiment shown in FIG. 6 is advantageous in that a barrier metal with a sufficient film thickness is formed without being affected by the step covering property and diffusion of gold into the diffusion layer is completely eliminated since the contact opening is buried by the vapor phase growth of tungsten and flattened and, in addition, platinum 5 as a barrier metal and titanium-tungsten 6 as a bonding layer are formed by sputtering even though the aspect ratio of the contact opening is large.

Figure 7:
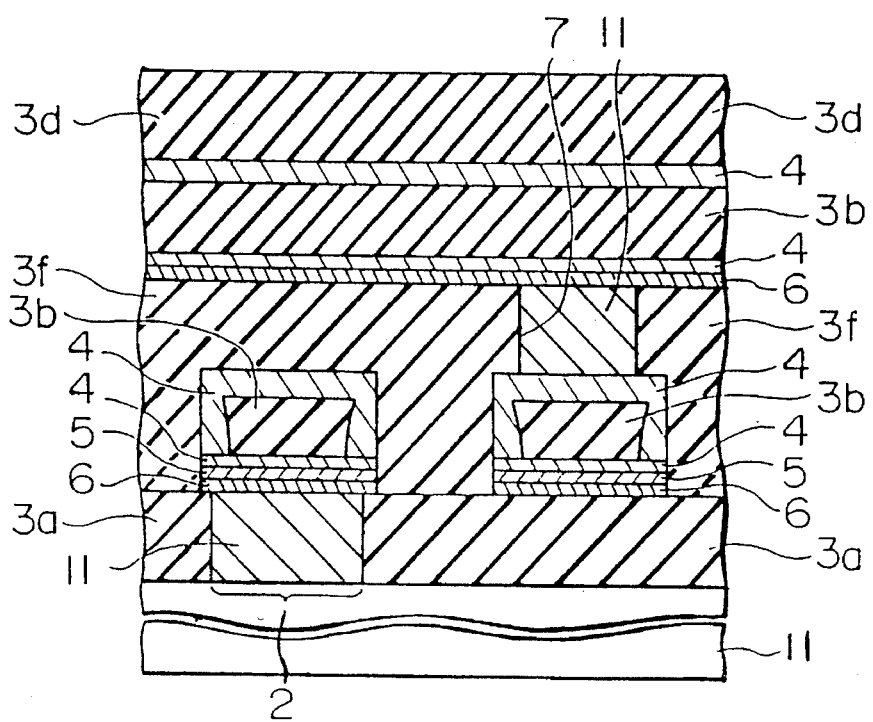

A semiconductor device as the fourth embodiment of the present invention is described, referring to FIG. 7.

Figure 6:
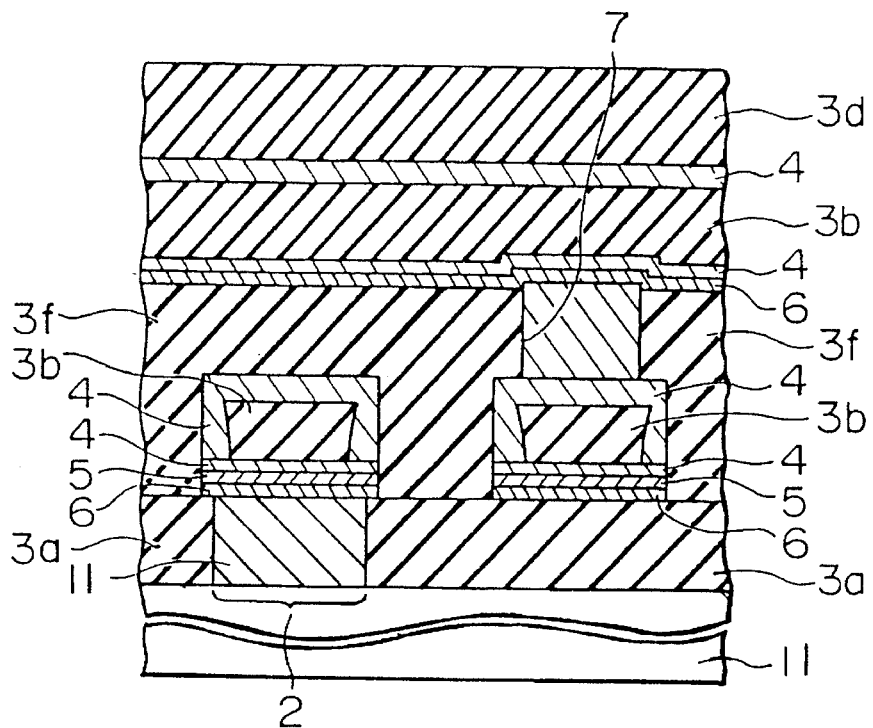
FIGS. 6 and 7 are respectively a rough sectional views showing a semiconductor device of the third and fourth embodiments of the present invention.

The fourth embodiment shown in FIG. 7 differs from the third embodiment shown in FIG. 6 in that tungsten 11 is buried in the through hole opening 7. The embodiment shown in FIG. 7 is advantageous in that tungsten can be uniformly buried up to the upper end above the through hole opening 7 even though the depths of through holes differ one from another in case a coating film system with different thicknesses of inter-layer isolation films between layers on the wiring is employed in accordance with the density of the wiring pattern. The description of the manufacturing method for semiconductor devices shown in FIG. 6 and 7 is omitted because the manufacturing method can be known from the description of the manufacturing method of the preceding embodiment. For example, platinum silicide for reducing the contact resistance is provided under titanium-tungsten 6 at the bottom of the contact opening 2.

The thickness of gold which surrounds the isolation film 3b is defined so that a skin depth δ is a depth where the current I attenuates to 1/e times (e: the base of natural logarithm) of the value $I_s$ of a current which runs through the surface and (3/2)×δ or over and (5/2)×δ or under. For example, assuming that the wiring material is gold, the specific permeability of the isolation film around the wiring is 1 and the frequency of current is 100 GHz, $$\delta = \sqrt{2/\omega\sigma\mu} = 0.24(\mu m)$$

is obtained and the thickness of gold wiring is preferably approximately 0.5 μm.

Provided, ω is angular frequency (2π.f), σ is the conductivity of the conductor and μ is the permeability of a substance around the wiring. If the thickness of the gold wiring is set to (3/2)×δ or over and (5/2)×δ or under, the current value at the center of the conductor can be maintained to be about 70% of the current value on the surface and the current density along the whole conductor becomes almost uniform and therefore the apparent resistance of the wiring can be prevented from being increased. If the thickness of the gold wiring is smaller than a value of this range, the sectional area of the conductoor is reduced and the resistance increases. If the thickness of the gold wiring is larger than (5/2)×δ, an area where the current density is reduced is formed at the center of conductor and the apparent resistance of the wiring increases. In any case, the semiconductor device is unsuitable to high speed operation.

What is claimed is:

1. A semiconductor device comprising a semiconductor substrate, an insulating layer formed to cover said semiconductor substrate, and a wiring layer selectively formed on and extended along said insulating layer, said wiring layer comprising a conductive layer having a cavity therein, and an isolation film filling said cavity, wherein a conductive region is provided between said insulating layer and said wiring layer, said conductive region being in contact with said insulating layer, and wherein said conductive region includes a layer of titanium-tungsten which is in contact with said insulating layer and a layer of platinum which is in contact with said wiring layer.

2. A semiconductor device comprising a semiconductor substrate, an insulating layer covering said semiconductor substrate, a conductive region formed on said insulating layer, a contact hole selectively formed in said insulating layer, and a wiring layer formed in contact with said conductive region and extending along said contact hole, said wiring layer including a first conductive film which is in contact with said conductive region, an isolation film formed on said first conductive film, and a second conductive film formed to cover said isolation film, said first and second conductive films having portions connected to each other so as to completely envelope said isolation film, wherein said conductive region includes a layer of titanium-tungsten which is in contact with said insulating layer and a layer of platinum which is in contact with said wiring layer.

3. A semiconductor device comprising a semiconductor substrate, an insulating layer covering said semiconductor substrate, a conductive region formed on said insulating layer, a contact hole selectively formed in said insulating layer, and a wiring layer formed in contact with said conductive region and extending along said contact hole, said wiring layer including a first conductive film which is in contact with said conductive region, an isolation film formed on said first conductive film, and a second conductive film formed to cover said isolation film, said first and second conductive films having portions connected to each other so as to completely envelope said isolation film, wherein said first and second conductive films and said portions thereof are made of gold.

4. A semiconductor device comprising a semiconductor substrate, an insulating layer covering said semiconductor substrate, contact holes selectively formed in said insulating layer, a conductive region including a conductive layer of titanium-tungsten selectively formed on said insulating layer in contact with said insulating layer and bottoms and edges of said contact holes, a layer of platinum on said conductive layer, and a wiring layer selectively formed on said platinum layer and including a first conductive film, an isolation film formed on said first conductive film and a second conductive film formed to cover said isolation film.

5. The semiconductor device according to claim 4, wherein said first and second conductive films are made of gold.

6. The semiconductor device according to claim 4, wherein said first and second conductive films are of metal conductor.

7. The semiconductor device according to claim 6, wherein said metal conductor is a main wiring material and has a thickness (3/2)×δ or over and (5/2)×δ or under where δ is a skin depth defined by $\delta = \sqrt{2/w\sigma\mu}$ where w is an angular frequency, σ is conductivity of said metal conductor and μ is permeability of an isolation film around said wiring layer.

* * * * *